(12) United States Patent
Pei et al.

(10) Patent No.: US 8,007,019 B1
(45) Date of Patent: Aug. 30, 2011

(54) CLAMP HAVING SYMMETRICAL CONFIGURATION

(75) Inventors: Shao-Kai Pei, Taipei Hsien (TW); Hou-Yao Lin, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 0 days.

(21) Appl. No.: 12/856,645

(22) Filed: Aug. 14, 2010

(30) Foreign Application Priority Data

Apr. 16, 2010 (TW) ................................. 99112088 A

(51) Int. Cl.
*B65G 7/12* (2006.01)
*C03B 35/20* (2006.01)

(52) U.S. Cl. .......................................... 294/118; 294/16
(58) Field of Classification Search ................ 294/3, 8.5, 294/11, 16, 25, 28, 31.1, 907, 118
See application file for complete search history.

(56) References Cited

U.S. PATENT DOCUMENTS

| | | | | |
|---|---|---|---|---|
| 354,431 A * | 12/1886 | Moore | ............................. | 294/16 |
| 2,482,576 A * | 9/1949 | Comstock | ....................... | 294/16 |
| 2,997,326 A * | 8/1961 | Daum | ............................ | 294/118 |
| 5,371,658 A * | 12/1994 | Christie | ........................... | 294/16 |
| 5,435,611 A * | 7/1995 | Campbell et al. | ................ | 294/16 |
| 7,478,853 B1 * | 1/2009 | Payette et al. | .................. | 294/118 |

\* cited by examiner

*Primary Examiner* — Paul T Chin
(74) *Attorney, Agent, or Firm* — Atlis Law Group, Inc.

(57) ABSTRACT

A clamp includes a pivot, a first lever, a second lever, and two stretched resilient members. The first and second levers are pivotally coupled to each other via the pivot. Each of the first and second levers includes a first handle and, a second handle arranged at opposite sides of the pivot. Each of the first and second levers includes a first jaw member arranged on a distal end of the second handle thereof and a second jaw member arranged on a distal end of the first handle. One of the stretched resilient members is interconnected between the first handle of the first lever and the second handle of the second lever, and the other of the stretched resilient member being interconnected between the second handle of the first lever and the first handle of the second lever.

9 Claims, 5 Drawing Sheets

CLAMP HAVING SYMMETRICAL CONFIGURATION

BACKGROUND

1. Technical Field

The present disclosure relates to sputtering technology, and particularly, to a clamp for clamping a lens tray during a sputtering process.

2. Description of Related Art

For purposes of improving optical performance, optical elements, for example, lenses generally have films deposited on opposite surfaces thereof using a sputtering process. During the sputtering process, lenses are fixed on a lens tray. After depositing a film on a surface of the lenses, the lens tray is manually turned over to deposit a film on another surface of the lenses, which risks contamination of the lenses. Therefore, it is desired to provide a clamp to hold and turn over lens trays during sputtering.

BRIEF DESCRIPTION OF THE DRAWINGS

Many aspects of the present clamp can be better understood with reference to the following drawings. The components in the drawings are not necessarily drawn to scale, the emphasis instead being placed upon clearly illustrating the principles of the present clamp. Moreover, in the drawings, like reference numerals designate corresponding parts throughout the several views.

DETAILED DESCRIPTION

Figure 1:
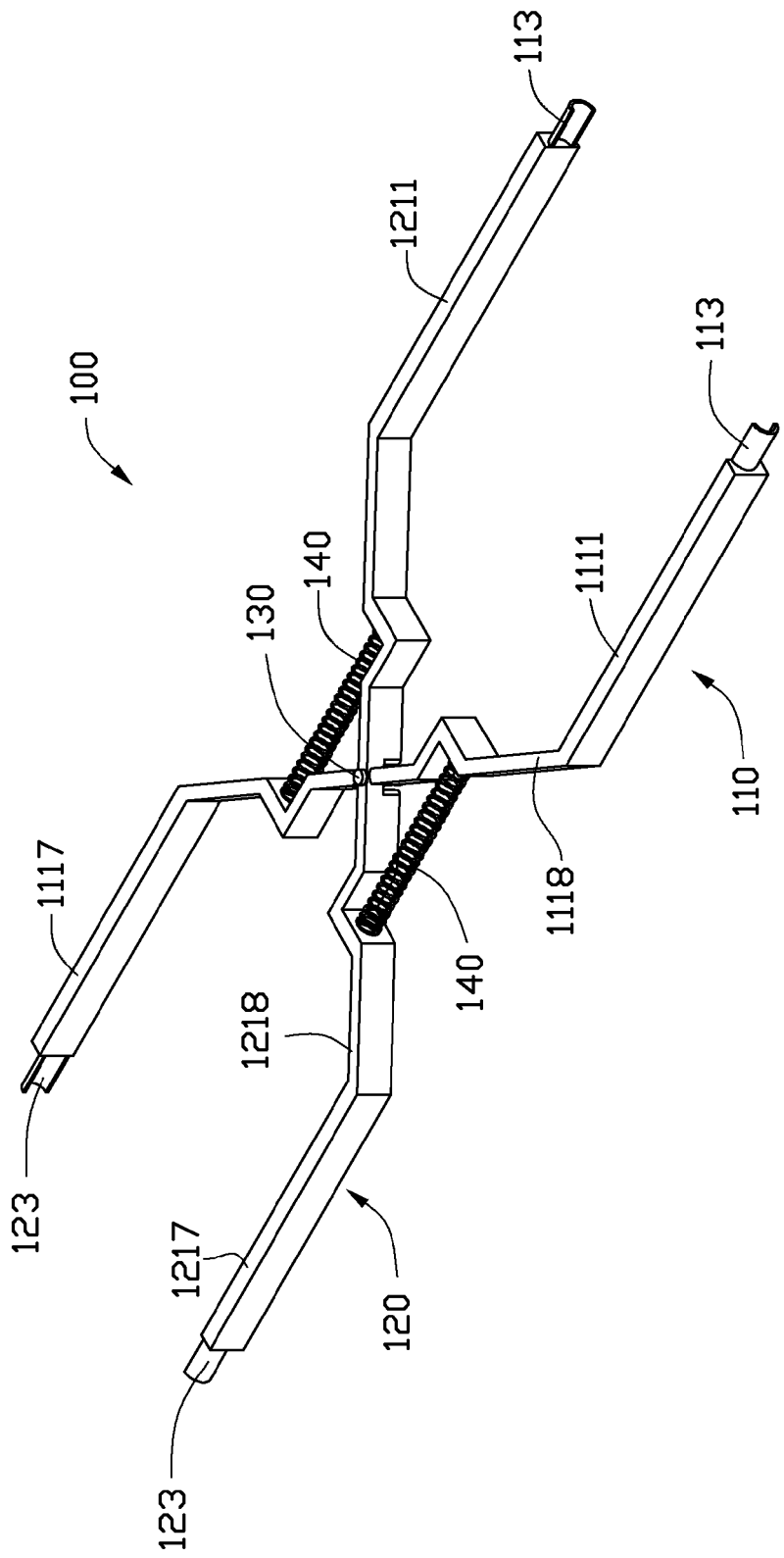
FIG. 1 is an isometric view of a clamp in accordance with an exemplary embodiment.

Referring to FIG. 1, an exemplary clamp 100 includes a first lever 110, a second lever 120, a pivot 130, two first jaw members 123, two stretched resilient members 140, and two second jaw members 113. The first lever 110 and the second lever 120 are pivotally coupled to each other via the pivot 130. The pivot 130 is configured for movement of the first lever 110 and second lever 120 toward and away from each other.

In detail, the first lever 110 includes a first handle 1111 and a second handle 1117 arranged at opposite sides of the pivot 130. The second lever 120 has a first handle 1211 and a second handle 1217 arranged at opposite sides of the pivot 130 as well. The first handle of each of the first and second levers 110, 120 are substantially parallel to the second handle thereof. The two first jaw members 123 are respectively arranged on a distal end of the second handles 1217, 1117, and the two second jaw members 113 are respectively arranged on a distal end of the first handles 1111, 1211. The first jaw member 123 and the second jaw member 113 are hollow semi-cylindrical. The two first jaw members 123 are configured for cooperating to clamp a workpiece therebetween, and the two second jaw members 113 are configured for cooperating to clamp a workpiece therebetween.

In addition, the first lever 110 further includes an intermediated portion 1118 interconnected between the first handle 1111 and the second handle 1117. The second lever 120 further includes an intermediated portion 1218 interconnected between the first handle 1211 and the second handle 1217. The two intermediate portions 1118, 1218 are pivotally coupled to each other via the pivot 130 as well. As such, the clamp 100 generally forms an X-shape. In the present embodiment, one end of the clamp 100 is a mirror image to the other end of the clamp 100.

One of two the stretched resilient member 140 is interconnected between the first handle 1111 of the first lever 110 and the second handle 1217 of the second lever 120, and the other of the stretched resilient member 140 is interconnected between the second handle 1117 of the first lever 110 and the first handle 1211 of the second lever 120. The stretched coil springs are substantially parallel to each other. The length of the resilient member 140 is resiliently adjustable under an external force. In the present embodiment, the resilient members 140 are spring coils.

Figure 2:
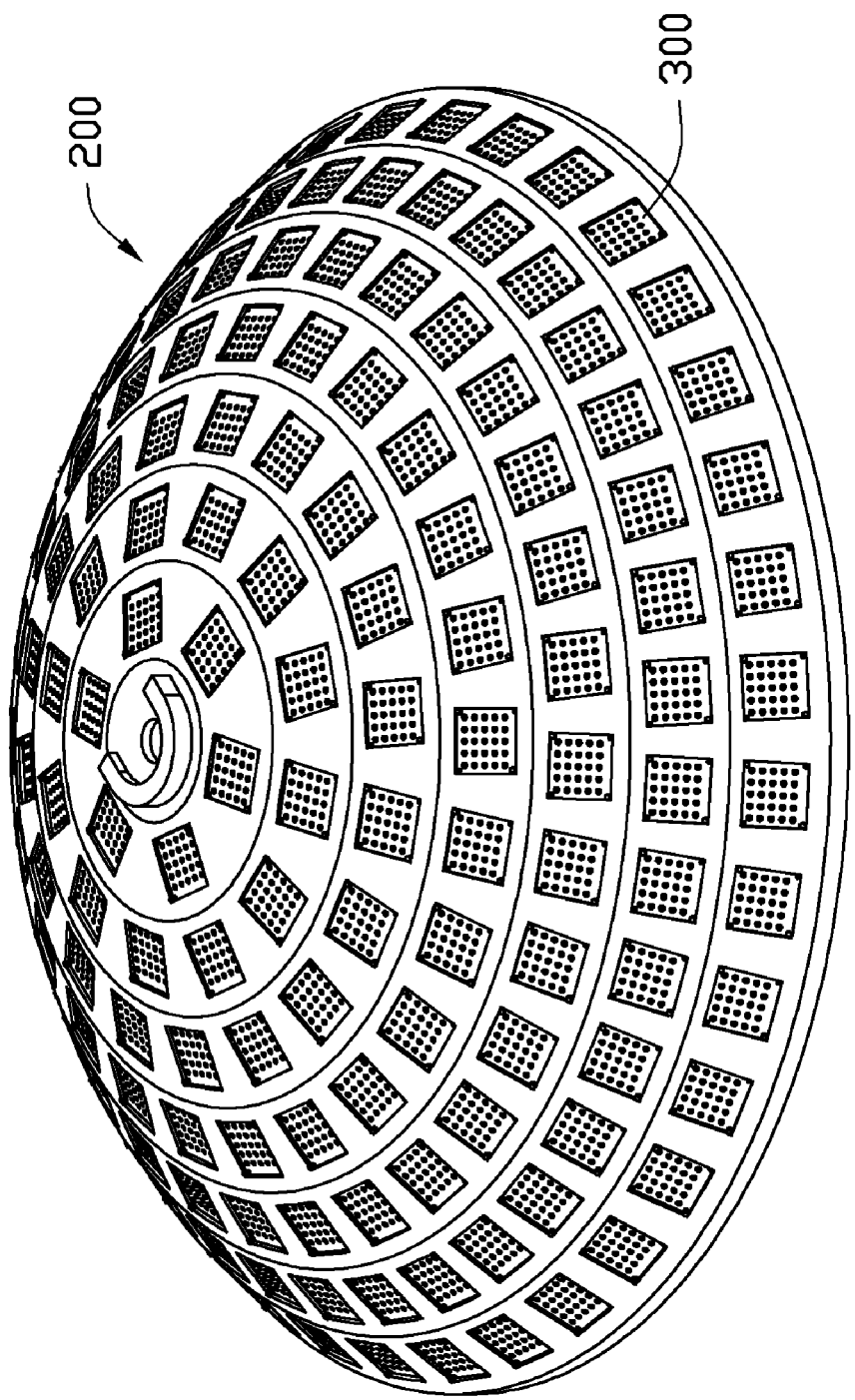
FIG. 2 is an isometric view of a typical sputtering bracket for holding lens trays during a sputtering process.
Figure 3:
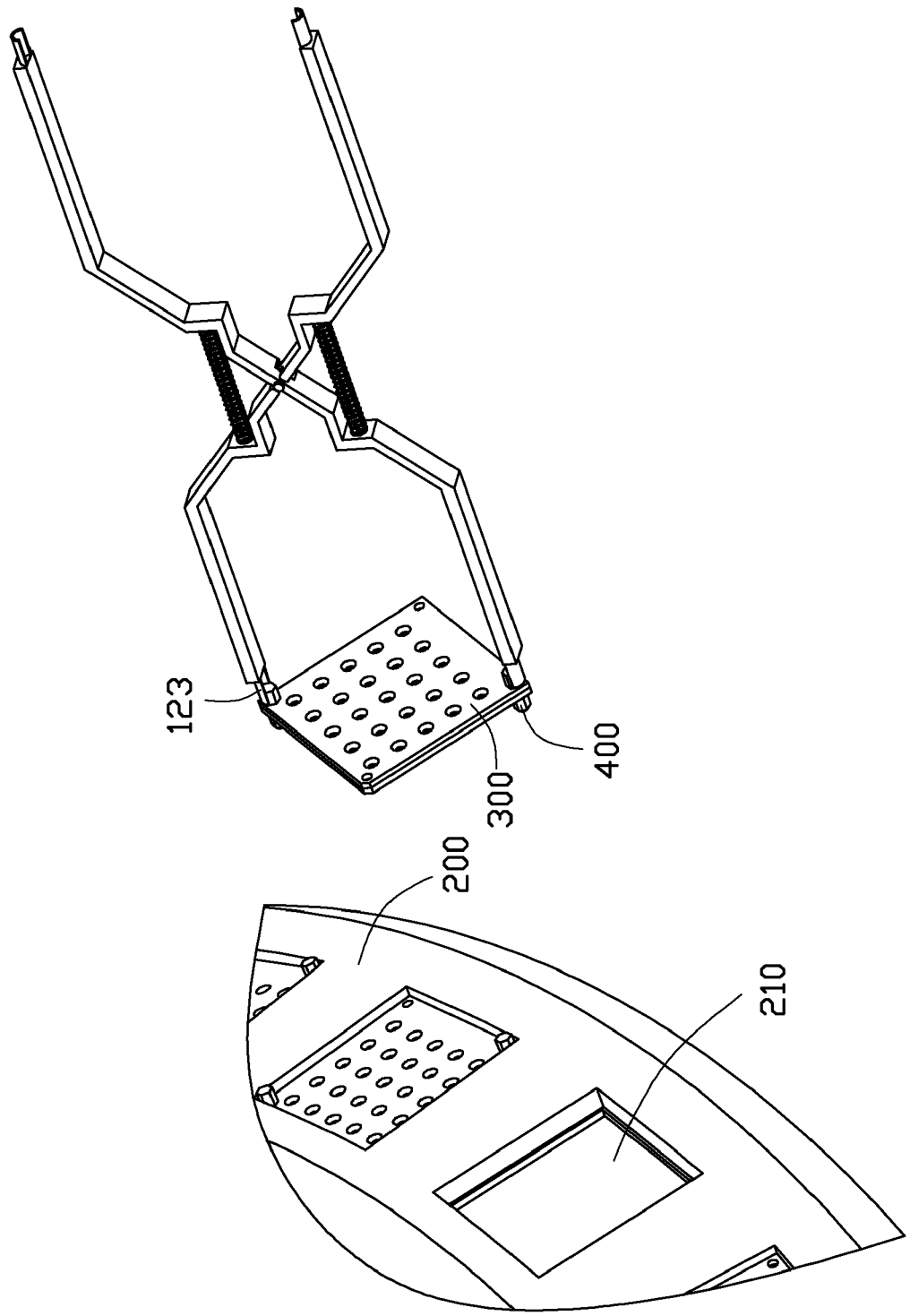
FIG. 3 shows taking a lens tray out of the sputtering bracket using the clamp of FIG. 1.
Figure 4:
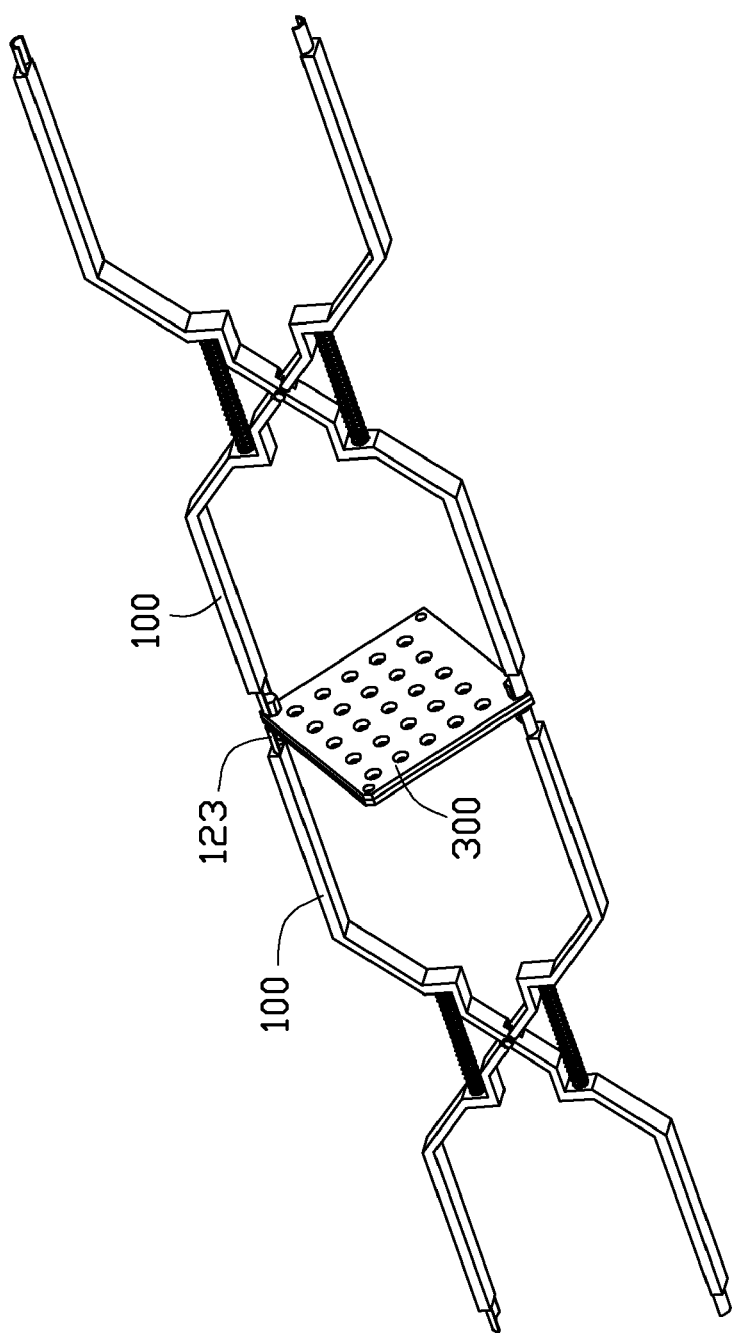
FIG. 4 shows turning over the lens tray using two clamps of FIG. 1.
Figure 5:
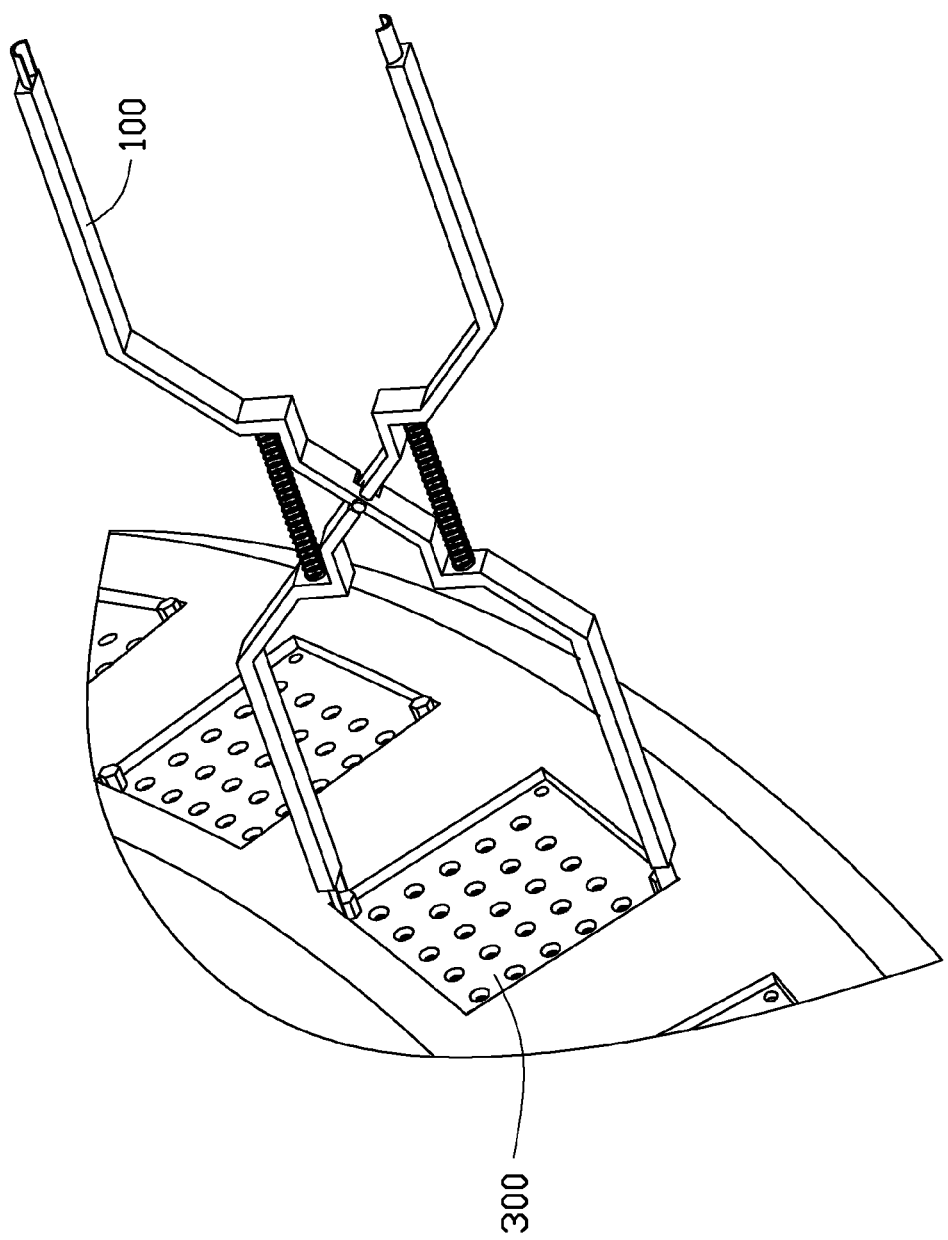
FIG. 5 shows putting the lens tray into the sputtering bracket using the clamp of FIG. 1.

Referring to FIGS. 2 and 3, a sputtering bracket 200 employed in a sputtering process usually has an umbrella-like shape. The sputtering bracket 200 defines a plurality of through holes 210. In actual use, a plurality of lens trays 300 each with a plurality of lenses fixed therein are respectively accommodated in a corresponding through hole 210 with fixtures 400, such as bolts, passing through corners of the lens tray 300. After forming a film on a surface of the lenses, each lens tray 300 is taken out of the sputtering bracket 200 with the first jaw members 123 clamping an end portion of each of the fixtures 400. Referring to FIG. 4, the other end portion of each of the fixtures 400 is subsequently clamped with another clamp 100, and then put the fixtures 400 into the through hole 210 using the another clamp 100. Thereby, referring to FIGS. 4 and 5, the lens tray 300 is turned over.

In the present embodiment, each of the two resilient members 140 interconnects a first lever 110 and a corresponding second lever 120. When an external force is applied to the first handle 1111 of the first lever 110 and the first handle 1211 of the second lever 120 for moving the first handle 1111 toward the first handle 1211 of the second lever 120, the resilient members 140 are tightened. As a result, the resilient members 140 apply a clamping force to the second first jaw members 123 and the second jaw members 113 for clamping the lens tray 300. Therefore, when clamping the lens tray 300, it is not necessary to continuously apply the external force onto the first handles 1111, 1211. Hence, much energy is saved.

Additionally, the clamp 100 is more convenient for clamping lens tray 300 due to the symmetrical configuration of the first lever 110 and the second lever 120. For instance, operators can use the first jaw members 123 and the second jaw members 113 at random when they hold the clamp 100. Therefore, much time is saved.

It is understood that the above-described embodiments are intended to illustrate rather than limit the disclosure. Variations may be made to the embodiments and methods without departing from the spirit of the disclosure. Accordingly, it is appropriate that the appended claims be construed broadly and in a manner consistent with the scope of the disclosure.

What is claimed is:

1. A clamp, comprising:
   a pivot;
   a first lever;
   a second lever, the first and second levers pivotally coupled to each other via the pivot; wherein each of the first and second levers includes a first handle and a second handle arranged at opposite sides of the pivot; each of the first and second levers includes a first jaw member arranged on a distal end of the second handle thereof and a second jaw member arranged on a distal end of the first handle thereof; the first handle and the second jaw member of the first lever are arranged symmetrically relative to the first handle and the second jaw member of the second lever; and the second handle and the first jaw member of the first lever are arranged symmetrically relative to the second handle and the first jaw member of the second lever; and two stretched resilient members, one of the stretched resilient members being interconnected between the first handle of the first lever and the second handle of the second lever, and the other of the stretched resilient members being interconnected between the second handle of the first lever and the first handle of the second lever.

2. The clamp of claim 1, wherein the two stretched resilient members are stretched spring coils.

3. The clamp of claim 1, wherein each of the first and second levers includes an intermediate portion interconnected between the respective first and second handles, the intermediate portions pivotally coupled to each other via the pivot.

4. The clamp of claim 1, wherein the first handle of each of the first and second levers is substantially parallel to the second handle thereof.

5. The clamp of claim 4, wherein the stretched coil springs are substantially parallel to each other.

6. The clamp of claim 1, wherein the first handle and the second jaw member of the first lever taken together with the first handle and the second jaw member of the second lever is arranged symmetrically relative to the second handle and the first jaw member of the first lever taken together with the second handle and the first jaw member of the second lever.

7. The clamp of claim 1, wherein each of the first jaw member and the second jaw member is hollow semi-cylindrical in shape.

8. A clamp, comprising:

a pivot;

a first lever;

a second lever, the first and second levers pivotally coupled to each other via the pivot; wherein each of the first and second levers includes a first handle and a second handle arranged at opposite sides of the pivot; each of the first and second levers includes a first jaw member arranged on a distal end of the second handle thereof and a second jaw member arranged on a distal end of the first handle thereof; and the first handle and the second jaw member of the first lever taken together with the first handle and the second jaw member of the second lever is arranged symmetrically relative to the second handle and the first jaw member of the first lever taken together with the second handle and the first jaw member of the second lever; and two stretched resilient members, one of the stretched resilient members being interconnected between the first handle of the first lever and the second handle of the second lever, and the other of the stretched resilient members being interconnected between the second handle of the first lever and the first handle of the second lever.

9. The clamp of claim 8, wherein the first handle and the second jaw member of the first lever are arranged symmetrically relative to the first handle and the second jaw member of the second lever, and the second handle and the first jaw member of the first lever are arranged symmetrically relative to the second handle and the first jaw member of the second lever.

* * * * *